United States Patent [19]
Boezen

[11] Patent Number: 5,497,074
[45] Date of Patent: Mar. 5, 1996

[54] BALANCED VOLTAGE-TO-CURRENT CONVERTER WITH QUIESCENT CURRENT CONTROL

[75] Inventor: Hendrik Boezen, Njimegen, Netherlands

[73] Assignee: U.S. Philips Corporation, New York, N.Y.

[21] Appl. No.: 227,829

[22] Filed: Apr. 14, 1994

[30] Foreign Application Priority Data

Apr. 16, 1993 [BE] Belgium ................................ 09300384

[51] Int. Cl.⁶ ..................................................... G05F 3/26
[52] U.S. Cl. ............................................ 323/316; 327/103
[58] Field of Search ............................. 327/103; 323/315, 323/316

[56] References Cited

U.S. PATENT DOCUMENTS

| | | | |
|---|---|---|---|
| 4,100,433 | 7/1978 | Duffy et al. | 327/103 |
| 4,574,233 | 3/1986 | Taylor | 323/316 |
| 5,341,087 | 8/1994 | Van Leeuwen | 323/316 |
| 5,404,097 | 4/1995 | Barou | 323/315 |

*Primary Examiner*—Peter S. Wong
*Assistant Examiner*—Shawn Riley
*Attorney, Agent, or Firm*—Bernard Franzblau

[57] ABSTRACT

A balanced voltage-to-current converter has two cells. Each cell has a first input terminal coupled to a first current source via a diode-connected first transistor and to an output terminal via the main current path of a third transistor, and a second input terminal coupled to a second (controllable) current source via the main current path of a second transistor. The control electrode of the third transistor is connected to the node between the second current source and the second transistor. The first input terminal of one of cell is connected to the second input terminal of the other cell and vice versa. The quiescent current through the third transistor is controlled by a differential amplifier which compares the voltage difference between the control electrode and a first main electrode of the third transistor with a reference voltage which is representative of the current through the third transistor. The output signals of the differential amplifiers are summed in an adder and are applied to control inputs of the second current sources.

17 Claims, 5 Drawing Sheets

5,497,074

BALANCED VOLTAGE-TO-CURRENT CONVERTER WITH QUIESCENT CURRENT CONTROL

BACKGROUND OF THE INVENTION

This invention relates to a voltage-to-current converter comprising a first cell, which cell comprises: a first input terminal, a second input terminal and an output terminal, a first current source, a first transistor having a first main electrode, a second main electrode and a control electrode, having a main current path defined by the first and the second main electrode of the first transistor and coupled to the first current source in a first node for the passage of a first current to be supplied by the first current source, and having a junction defined by the first main electrode and the control electrode of the first transistor and connected in a forward direction between the first node and the first input terminal, a second current source, a second transistor of a first conductivity type, having a first main electrode connected to the second input terminal, a control electrode connected to the first node, and a second main electrode coupled to the second current source in a second node, and a third transistor of the first conductivity type, having a first main electrode connected to the first input terminal, a control electrode connected to the second node, and a second main electrode coupled to the output terminal.

Such a voltage-to-current converter is known from U.S. Pat. No. 4,574,233. When an input voltage source is connected to the first input terminal via a conversion resistor this will produce an input current from the first input terminal to the output terminal via the third transistor. The second input terminal is connected to the first supply terminal, which acts as a reference voltage source. The input current begins to flow as soon as the voltage of the input voltage source has become smaller than the reference voltage of the reference voltage source. This known converter has a substantially linear transmission from the first input terminal to the output terminal but operates only for one current direction of the input current. This problem can be solved by duplicating the known converter as a first cell and a second cell, one cell having its second input terminal connected to the first input terminal of the other cell. However, this gives rise to a problem with the quiescent-current setting of the third transistor in each of the two cells. As a result of tolerances the quiescent current is not only indeterminate but the quiescent current of the third transistor in one cell also flows through the conversion resistor of the other cell and vice versa. An undesirable effect of this is that the reference voltage of one cell depends on the quiescent current in the third transistor of the other cell. Moreover, for an accurate processing of small input voltages, it is required to have a small quiescent current through the third transistor so as to obtain a small offset voltage across the conversion resistors.

SUMMARY OF THE INVENTION

It is an object of the invention to provide a low-offset balanced voltage-to-current converter with a linear transmission. To this end, according to invention, the voltage-to-current converter of the type defined in the opening paragraph is characterised in that the second current source is a controllable current source having a control input, the cell further comprises a differential amplifier having an output and inputs which are arranged to compare a voltage difference between the control electrode and the first main electrode of the third transistor with a reference voltage which is a measure of the current through the third transistor, in that the voltage-to-current converter further comprises: a first and a second common input terminal, a second cell identical to the first cell, the first input terminal of the first cell and the second input terminal of the second cell being interconnected at the first common input terminal, and the second input terminal of the first cell and the first input terminal of the second cell being interconnected at the second common input terminal, an adder having inputs coupled to the output of the respective differential amplifiers of the first and the second cell, and having an output coupled to the respective control inputs of the second current source of the first and the second cell to supply a control signal to the control inputs, and a reference voltage source to supply the reference voltage for the first and the second cell.

Each of the cells has a differential amplifier which compares the voltage between the control electrode and the first main electrode of the third transistor with a reference voltage which is a measure of the current through the third transistor. The output of the differential amplifier supplies a signal which reaches the control input of the controllable second current source via the adder and which produces a current variation in the second current source. The current variation produces a voltage variation on the second node and hence on the control electrode of the third transistor, thereby controlling the current through this transistor. The output of the adder is connected to the control inputs of the controllable current sources of both cells. The effect of this is that the quiescent currents through both third transistors are controlled if one of the two quiescent currents decreases below a minimum value.

It is to be noted that a balanced voltage-to-current converter with cells of another type is known from U.S. Pat. No. 4,100,433. The cells in this known converter do not comprise a third transistor.

A first embodiment of a voltage-to-current converter in accordance with the invention is characterised in that the reference voltage source comprises: a third current source, a third node and a fourth node, a first resistor connected between the fourth node and the first main electrode of the third transistor of the first cell, a second resistor connected between the fourth node and the first main electrode of the third transistor of the second cell, a junction formed by a control electrode and a first main electrode of a fourth transistor, which junction is connected between the third node and the fourth node, the first and the second cell each having one of the inputs of the differential amplifier connected to the control electrode of the third transistor and having the other input connected to the third node.

The junction voltage of the fourth transistor functions as a reference voltage whose magnitude depends on the current of the third current source. The fourth node between the first resistor and the second resistor acts as a floating reference whose voltage is the average of the voltages on the first main electrodes of the third transistor in the first cell and in the second cell. The current of the third current source flows to the first and the second common input terminals via the first and the second resistor. The voltage drop across the first and the second resistor provides an error voltage which is not a measure of the current through the respective third transistors. This error voltage can be reduced by selecting small values for the first and the second resistor but the shunt effect of the first and the second resistor to the first and the second common input terminals imposes a lower limit on these values. The input current will then flow partly via the first and the second resistor instead of through the third transistors, as a result of which the accuracy of the voltage-to-current conversion decreases. However, the shunt effect can be reduced. To this end a second embodiment of a voltage-to-current converter in accordance with the invention is characterised in that the fourth transistor is of a second conductivity type opposite to the first conductivity type, and in that the control electrode, the first main electrode and the second main electrode of the fourth transistor are connected to the fourth node, the third node and a first supply terminal, respectively.

The fourth transistor is now arranged as a voltage follower, the current of the third current source being drained almost completely to the first supply terminal. The fourth node between the first and the second resistor is now loaded to a substantially smaller extent so that the first and the second resistor may have substantially larger values and the shunt effect is reduced accordingly.

Although the voltage-to-current converter can be constructed by means of discrete components it is often preferred to use a construction which is integrated in a semiconductor body or chip. In the last-mentioned case it is desirable to avoid resistors whenever possible. For this purpose a third embodiment of a voltage-to-current converter in accordance with the invention is characterised in that the reference voltage source comprises: a third current source, a third node, a fifth transistor of second conductivity type opposite to the first conductivity type, having a first main electrode connected to the third node, a control electrode connected to the first main electrode of the third transistor of the first cell, and a second main electrode coupled to a first supply terminal, and a sixth transistor of the second conductivity type, having a first main electrode connected to the third node, a control electrode connected to the first main electrode of the third transistor of the second cell, and a second main electrode coupled to the first supply terminal, the first and the second cell each having one of the inputs of the differential amplifier connected to the control electrode of the third transistor and having the other input connected to the third node.

In this embodiment said fourth transistor has been replaced by a double transistor, i.e. the fifth and the sixth transistor, whose first main electrodes are coupled to the third current source and whose control electrodes are connected to the first main electrode of the relevant third transistor. This construction operates without a first and a second resistor. Here, the voltage on the third node also remains dependent upon the average of the voltages on the first main electrodes of the third transistors of the first and the second cell.

A simple solution for the differential amplifier and the adder in the first and the second cell is provided by a fourth and a fifth embodiment of the voltage-to-current converter in accordance with the invention which, if said fourth transistor and the first and the second resistor are used, is characterised in that in the first cell and in the second cell the differential amplifier comprises a seventh transistor of the first conductivity type, which seventh transistor has a control electrode connected to the third node, a first main electrode coupled to the second node, and a second main electrode coupled to the control input of the second current source, and in that the third node is connected to the junction of the fourth transistor via a diode-connected eighth transistor, and which if said sixth and said fifth transistor are used is characterised in that in the first cell and in the second cell the differential amplifier comprises a seventh transistor of the first conductivity type, which seventh transistor has a control electrode connected to the third node, a first main electrode coupled to the second node, and a second main electrode coupled to the control input of the second current source, and in that the third node is connected to the first main electrodes of the fifth and the sixth transistor via a diode-connected eighth transistor.

The differential amplifier has been reduced to a single seventh transistor. The voltage drop across the diode-connected eighth transistor compensates for the voltage difference between the control electrode and the first main electrode of the seventh transistor. Adding is effected by interconnecting the two main electrodes of the respective seventh transistors.

A seventh embodiment provides a simple solution for the second current source, which is constructed as a controllable current source, and is characterised in that in the first and the second cell the second current source is formed by a ninth transistor of a second conductivity type opposite to the first conductivity type, which ninth transistor has a first main electrode coupled to a second supply terminal, a second main electrode coupled to the second node, and a control electrode forming the control input of the second current source.

The current of the second current source flows to the first or the second common input terminal via the junction of the first transistor and causes offset in the conversion resistors to be connected. The offset can be reduced and for this purpose a seventh embodiment of a voltage-to-current converter in accordance with the invention is characterised in that in the first and the second cell the first transistor is of a second conductivity type opposite to the first conductivity type, which first transistor has a control electrode, a first main electrode and a second main electrode connected to the first main electrode of the third transistor, the first node and the first supply terminal, respectively.

The first transistor is connected as a voltage follower, as a result of which the current of the first current source flows almost completely to the first supply terminal and no longer to the relevant common input terminal.

BRIEF DESCRIPTION OF THE DRAWINGS

These and other aspects of the invention will now described and elucidated with reference to the accompanying drawings, in which.

In these Figures parts having the same function or purpose bear the same reference numerals.

DESCRIPTION OF THE PREFERRED EMBODIMENTS

The invention will be described for embodiments using bipolar transistors whose base, emitter and collector correspond to, respectively, the control electrode, the first main electrode and the second main electrode of the transistor. However, all of the transistor circuits shown herein may readily be equipped wholly or partly with unipolar (FET) transistors. The control electrode, the first main electrode and the second main electrode then correspond to, respectively, the gate, the source and the drain of the unipolar transistor.

Figure 1:
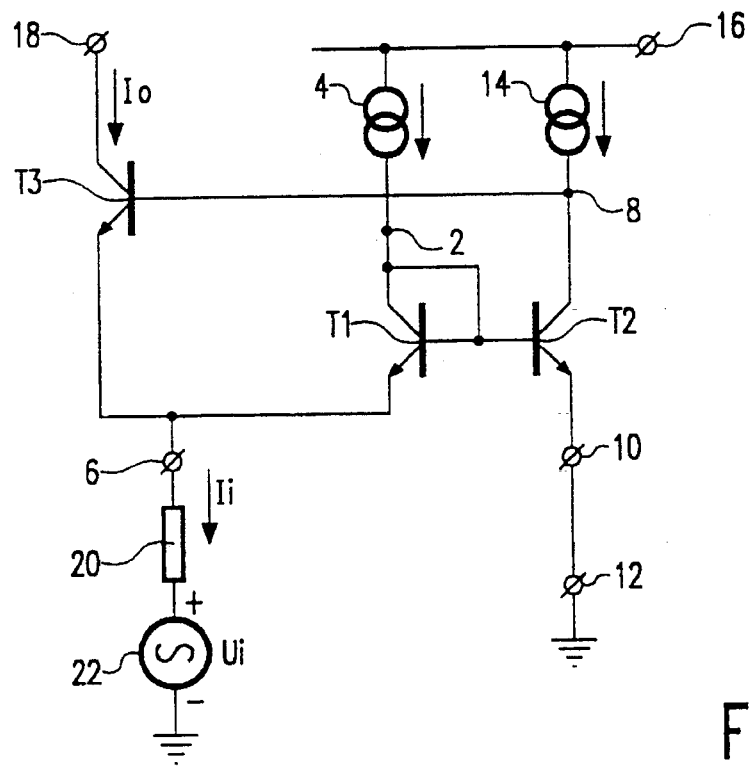
FIG. 1 shows a prior art voltage-to-current converter.
Figure 2:
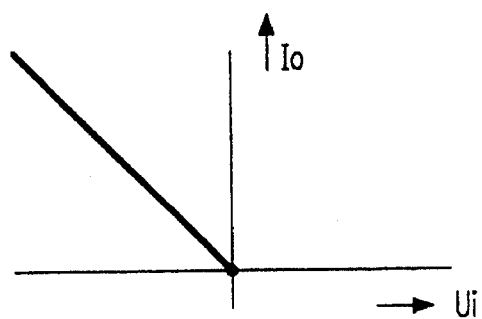
FIG. 2 shows a conversion characteristic of the voltage-to-current converter in FIG. 1.

FIG. 1 shows the circuit diagram of a cell, two such cells being used in a balanced voltage-to-current converter. The collector of a diode-connected first NPN transistor T1 is connected to a first current source 4 via a first node 2. The emitter of the transistor T1 is connected to a first input terminal 6. A second NPN transistor T2 has its base, collector and emitter connected to the first node 2, a second node 8 and a second input terminal 10, respectively. The second input terminal 10 is connected to a first supply terminal 12, which is assumed to be connected to ground. The second node 8 is connected to a second supply terminal 16 via a second current source 14, the first current source 4 being also connected to this second supply terminal. A third NPN transistor T3 has its base, collector and emitter connected to the second node 8, an output terminal 18 and the first input terminal 6, respectively. An input voltage source 22 is connected to the first input terminal 6 via a conversion resistor 20 and supplies an input voltage $U_i$, which produces a current $I_i$ through the conversion resistor 20. If the input voltage $U_i$ is zero no current will flow through the transistor T3, so that the output current $I_o$ in the output terminal 18 is also zero. However, the current from the first current source 4 flows through the conversion resistor 20 via the first transistor T1 and produces an offset voltage across this resistor, which offset voltage is to be overcome by the voltage source 22. The current from the second current source 14 flows to the second input terminal 10 through the transistor T2. The offset on the first input terminal 6 can be compensated by also arranging a conversion resistor in series with the second input terminal 10. In the case of identical transistors T1 and T2 and equal currents through the transistors T1 and T2 the voltage on the first input terminal 6, if the offset is ignored, will be equal to the voltage on the second input terminal 10, in the present case ground potential. The current $I_i$ through the conversion resistor 20 is then determined almost wholly by the input voltage $U_i$. The entire current $I_i$ flows through the third transistor T3 because the current through the first transistor T1 cannot assume another value than that dictated by the first current source 4. The transmission of the input voltage $U_i$ to the output current $I_o$ is therefore substantially linear as is shown in FIG. 2. However, this cell is only suitable for input voltages which are negative relative to ground. The output current is zero for positive input voltages.

Figure 4:
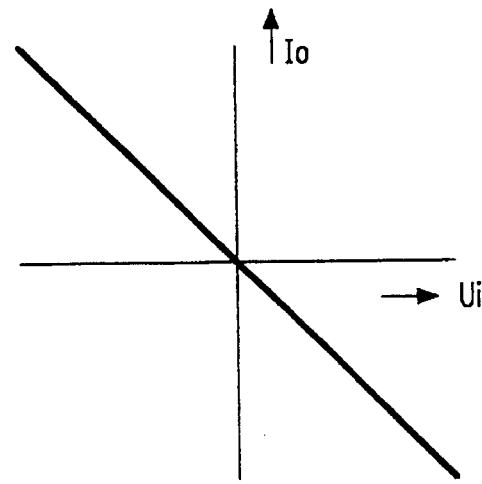
FIG. 4 shows a conversion characteristic of a voltage-to-current converter in accordance with the invention.
Figure 3:
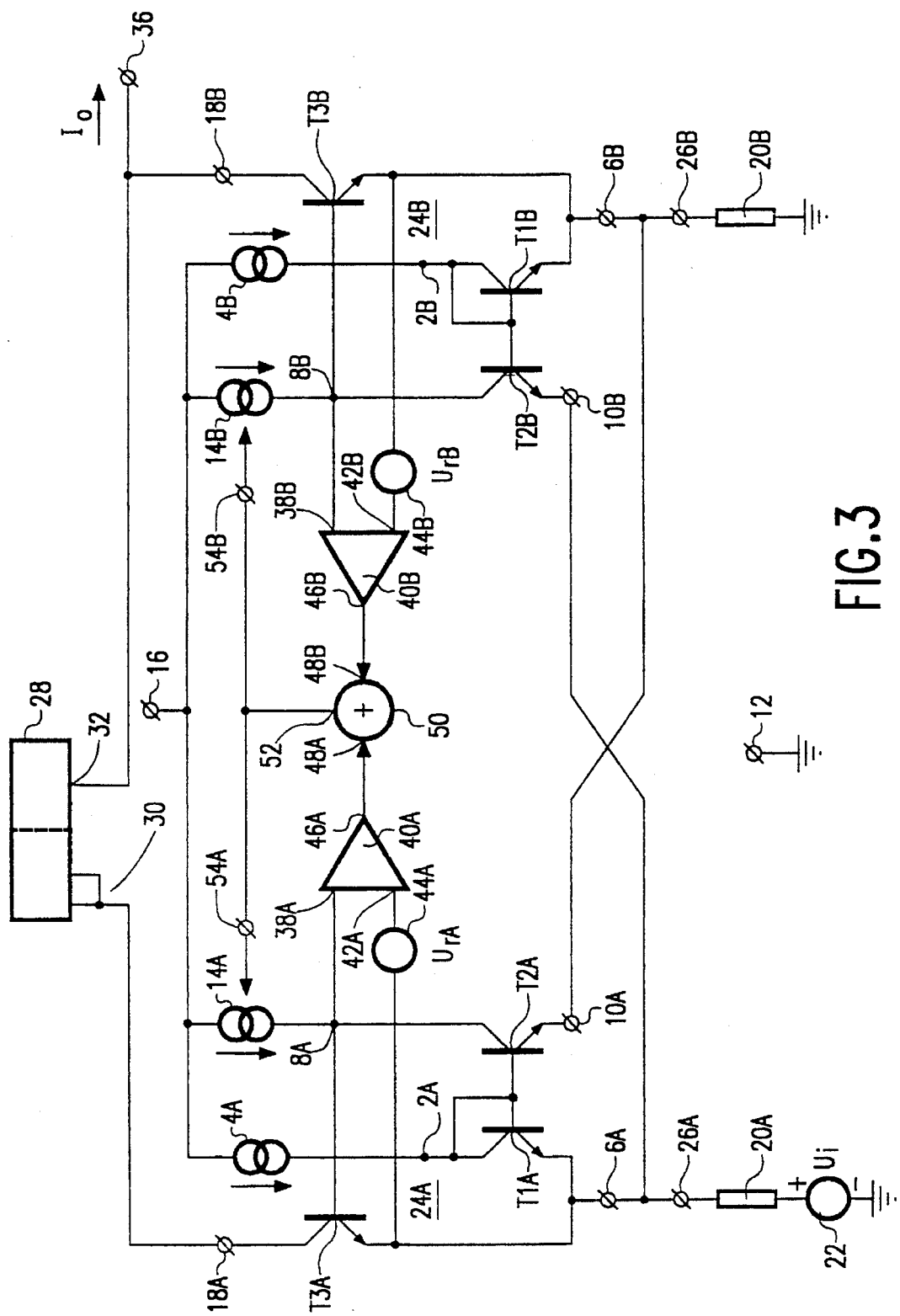
FIG. 3 shows a first embodiment of a voltage-to-current converter in accordance with the invention.

FIG. 3 shows a balanced converter comprising two cells 24A and 24B, the references of corresponding items of the cells bearing the suffixes A and B. The first input terminal 6A of the first cell 24A and the second input terminal 10B of the second cell 24B are interconnected at a first common input terminal 26A, to which the input voltage source 22 is connected via the conversion resistor 20A. The second input terminal 10A of the first cell 24A and the first input terminal 6B of the second cell 24B are interconnected at a second common input terminal 26B, which is connected to ground via a conversion resistor 20B. If the input voltage $U_i$ is negative relative to ground a current will flow through the transistor T3A. If the input voltage is positive relative to ground a current will flow through the transistor T3B. If desired, the two currents can be summed by means of a current mirror 28, which has an input 30 connected to an output terminal 18A and which has an output 32 connected to an output terminal 18B and to a common output terminal 36. An output current $I_o$, whose relationship with the input voltage $U_i$ is shown in FIG. 4, is available at the output terminal 36.

The base voltage of the transistor T3A on the node 8A is applied to a first input 38A of a differential amplifier 40A, which has a second input 42A connected to the emitter of the transistor T3A via a reference voltage source 44A. An output 46A of the differential amplifier 40A is connected to an input 48A of an adder 50, which has an output 52 coupled to a control input 54A of the second current source 14A, which is now formed by a controllable current source. The reference voltages $U_{rA}$ and $U_{rB}$ of the reference voltage sources 44A and 44B are representative of the current through the transistors T3A and T3B. The differential amplifiers 40A and 40B compare the base-emitter voltages of the transistors T3A and T3B with their respective reference voltages $U_{rA}$ and $U_{rB}$ and control the quiescent current though the relevant transistor to a desired value. Since the output 52 of the adder 50 is connected to both control inputs 54A and 54B the minimum value of the quiescent currents in the transistors T3A and T3B is set to a desired value. This enables the voltage-to-current converter to be operated in class A/B, so that a low offset can be obtained on the common input terminals 26A and 26B with a small quiescent current. Indeed, with zero input voltage the quiescent currents flow through the conversion resistors and produce across these resistors an offset voltage which reduces the accuracy of the voltage-to-current conversion for low input voltages.

Figure 5:
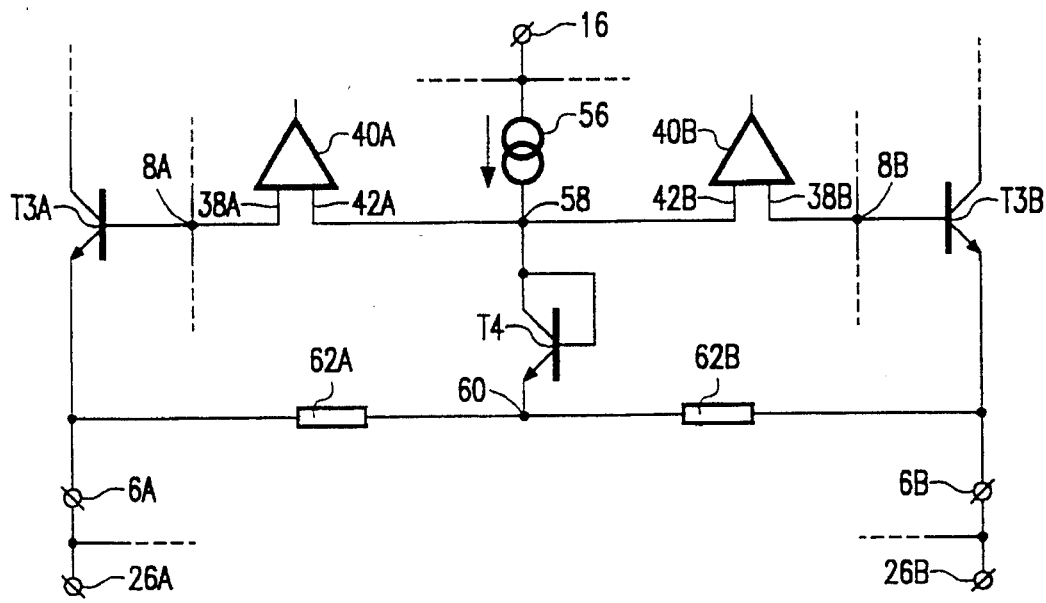
FIG. 5 shows a part of a first alternative embodiment of a voltage-to-current converter in accordance with the invention.

FIG. 5 shows a part of the circuit shown in FIG. 3, the reference voltage sources 44A and 44B being combined to a common reference voltage source comprising a third current source 56, which is coupled to a diode-connected fourth NPN transistor T4 at a third node 58, which transistor has its emitter connected to a fourth node 60, which is connected to the emitter of the transistor T3A via a first resistor 62A and to the emitter of the transistor T3B via a second resistor 62B. The voltage on the fourth node 60 is equal to the average emitter voltage of the transistors T3A and T3B. The inputs 38A and 38B of the differential amplifiers 40A and 40B are connected to the associated second nodes 8A and 8B and the other inputs 42A and 42B are connected to the third node 58. The base-emitter voltage of the transistor T4 is dictated by its emitter area and by the current of the current source 56. The control system tends make the base-emitter voltages of the transistors T3A/T3B equal to the base-emitter voltage of the transistor T4. The ratio between the geometries of the transistors T4 and T3A/T3B determines the magnitude of the quiescent current through the transistors T3A/T3B at an input voltage $U_i$ equal to zero.

The current from the third current source 56 flows to the common input terminals 26A and 26B via the resistors 62A and 62B, which may give rise to an offset current as a result of inequality of the resistors 62A and 62B. Moreover, the voltages across the resistors 62A/62B give rise to an error voltage in series with the junction voltage of the transistor T4, so that this voltage is not a measure of the quiescent current through the transistors T3A/T3B. This error voltage can be reduced by selecting small values for the resistors 62A/62B but the shunt effect of the resistors 62A/62B to the common input terminals 26A/26B imposes a lower limit on these values. The input current will then flow partly via the resistors 62A/62B instead of through the transistors T3A/T3B, as a result of which the accuracy of the voltage-to-current conversion decreases.

Figure 6:
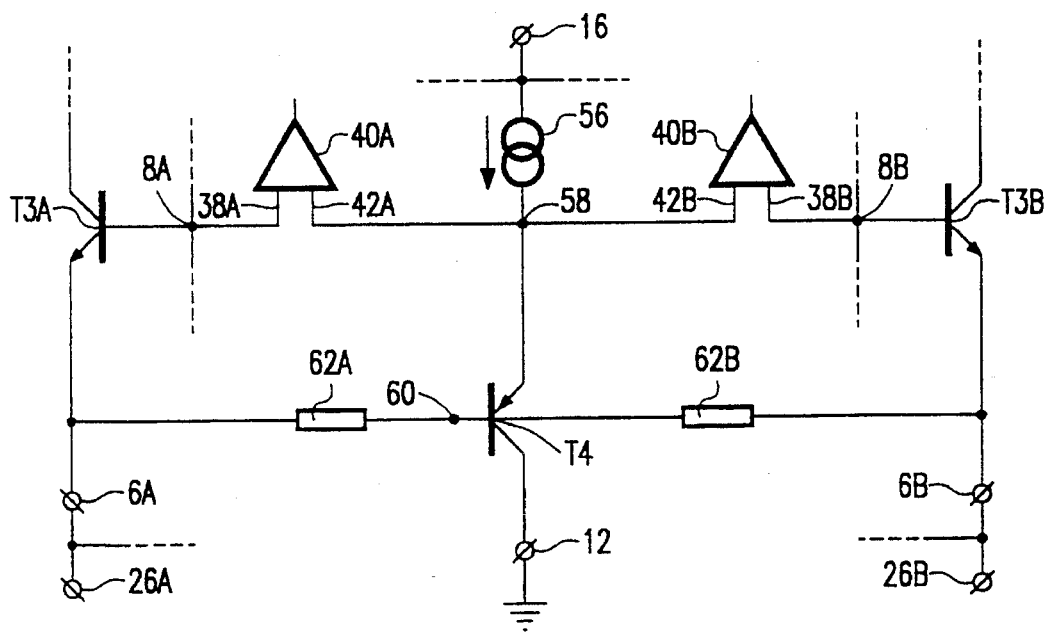
FIG. 6 shows a part of a second alternative embodiment of a voltage-to-current converter in accordance with the invention.

However, the shunt effect can be reduced by means of the circuit shown in FIG. 6 which is largely identical to that shown in FIG. 5 but in which the diode-connected NPN transistor T4 has been replaced by a PNP emitter-follower transistor T4 whose base, emitter and collector are connected to the fourth node 60, the third node 58 and ground, respectively. The current of the third current source is now drained almost completely to ground. The fourth node 60 is now loaded to a substantially smaller extent so that the resistors 62A and 62B may have substantially larger values and the shunt effect is reduced accordingly.

Figure 7:
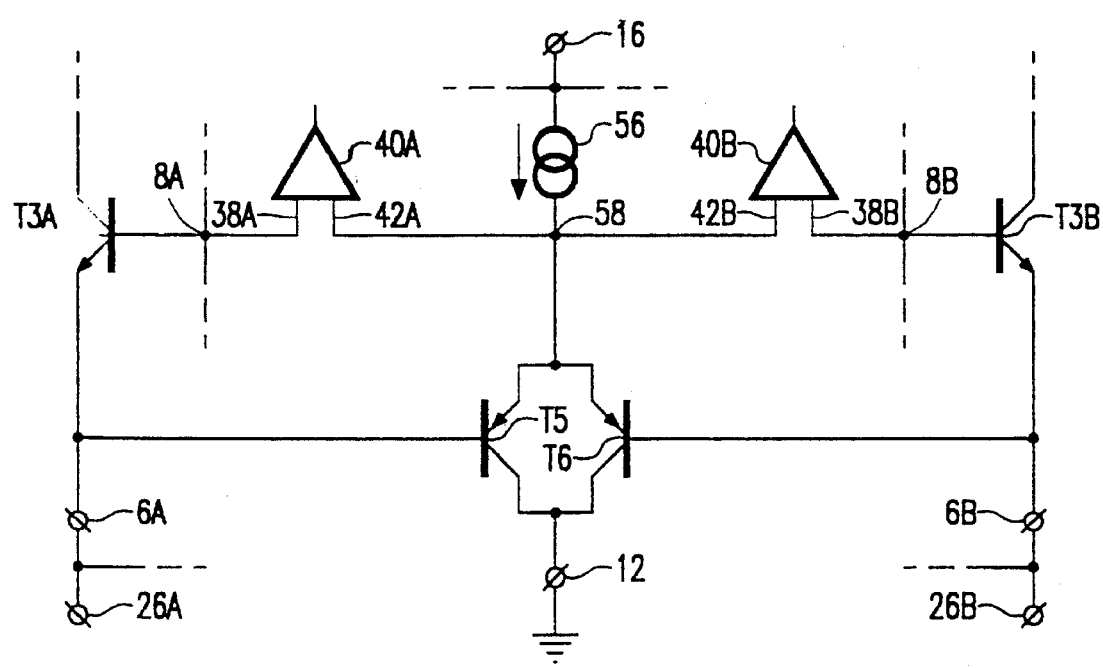
FIG. 7 shows a part of a third alternative embodiment of a voltage-to-current converter in accordance with the invention.

In the circuit shown in FIG. 7, which is largely identical to that in FIG. 6, the resistors 62A and 62B may be dispensed with. The resistors 62A/62B are not included and the PNP transistor T4 is replaced by two PNP transistors T5 and T6, whose emitters are connected to the third node 58, whose collectors are connected to ground, and whose bases are connected to the emitters of the transistors T3A and T3B, respectively.

Figure 8:
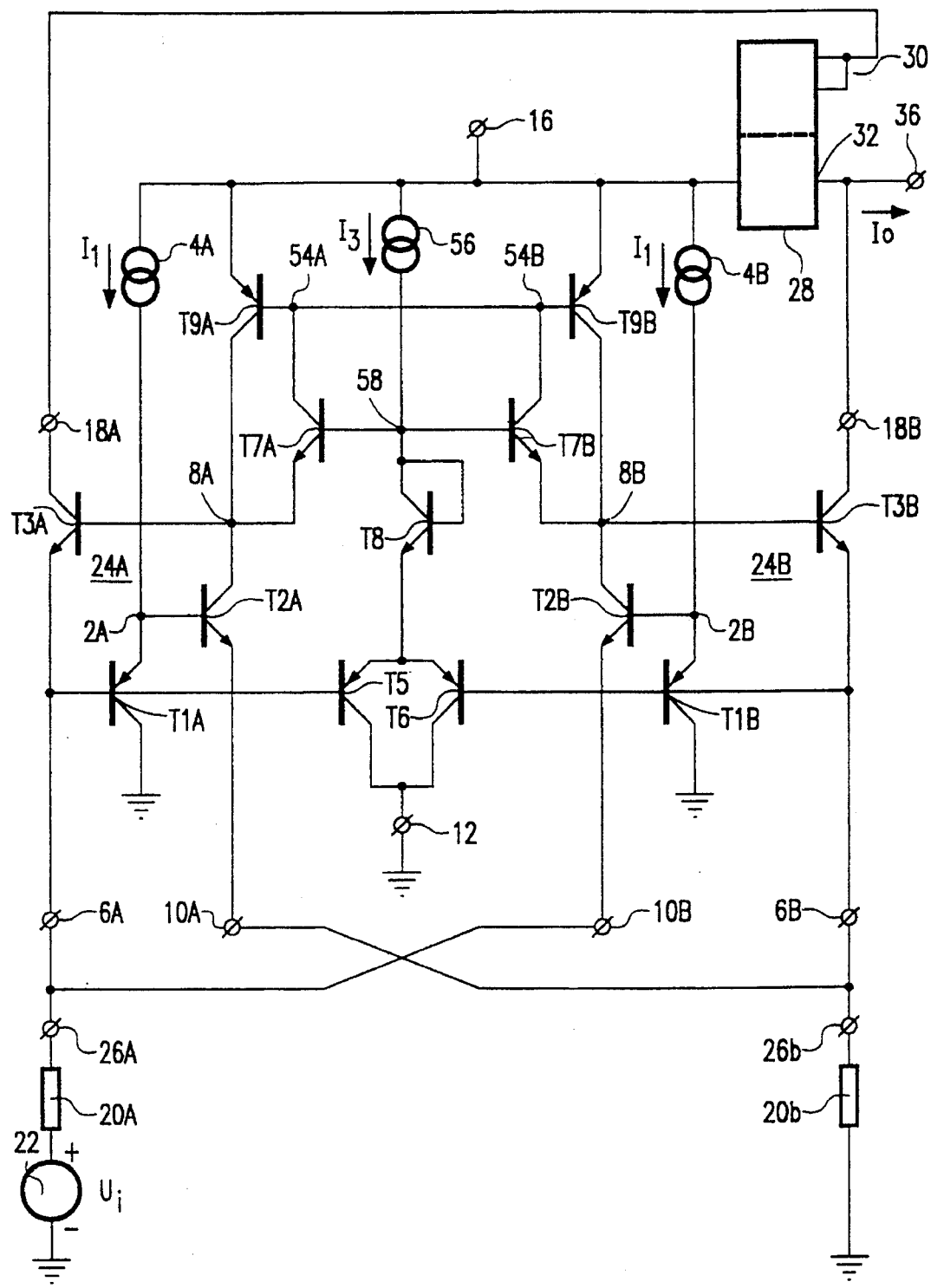
FIG. 8 shows a further embodiment of a voltage-to-current converter in accordance with the invention.

In all the embodiments shown so far the differential amplifiers 40A/40B and the controllable current sources 14A/14B may be realised by means of single transistors to save on parts. This is illustrated in FIG. 8, which is based on the variant shown in FIG. 7. Here, the differential amplifier 40A in the first cell 24A is embodied in the NPN transistor T7A, which has its base, emitter and collector connected to the third node 58, the second node 8A and the control input 54A, respectively. Likewise, the second cell 24B comprises an NPN transistor T7B. The effect of the adder 50 shown in FIG. 3 is achieved by interconnecting the collectors of the transistors T7A and T7B. If desired, this interconnection point may be connected to the second supply terminal 16 by a resistor. The voltage difference between the base and the emitter of the transistors T7A/T7B is compensated by the voltage drop across the base-emitter junction of a diode-connected eighth NPN transistor T8 arranged between the third node 58 and the emitters of the transistors T5 and T6.

The controllable current source 14A of the first cell 24A comprises a ninth PNP transistor T9A having its base, emitter and collector coupled to the control input 54A, the second supply terminal 16 and the second node 8A, respectively. Likewise, the controllable current source 14B in the second cell 24B comprises a PNP transistor T9B.

In order to minimise the offset on the common input terminals 26A and 26B the transistors T1A and T1B are constructed as PNP emitter-followers whose bases, emitters and collectors are connected to the emitter of the third transistor T3A/T3B, the first node 2A/2B and ground, respectively. The current of the current sources 4A and 4B now flows directly to ground and no longer through the common input terminals 26A and 26B.

The quiescent current through the transistors T3A and T3B can be calculated as follows. The input voltage $U_i$ is zero under quiescent current conditions and the voltages on the common input terminals 26A and 26B are substantially equal on account of the symmetry. The base-emitter voltages of the transistors T1A and T2A are then also equal and now there is a fixed relationship A between the collector current $Ic_{1A}$ of the transistor T1A and the collector current $Ic_{2A}$ of the transistor T2A:

$$Ic_{2A} = A * I_1 \quad (1)$$

Here, $I_1$ is the current supplied to the transistor T1A by the first current source 4A. The transistors T3A, T7A, T8 and T5 form a translinear loop, on account of which the product of the collector currents $Ic_{3A}$ and $Ic_{7A}$ of the transistors T3A and T7A is equal to the product of the collector currents $Ic_8$ and $Ic_5$ of the transistors T8 and T5. The collector current $Ic_8$ is equal to the current 13 of the third current source 56. The collector current $Ic_5$ is a fraction of the current $I_3$. The loop then complies with:

$$Ic_{3A} * Ic_{7A} = I_3 * B * I_3 = B * (I_3)^2 \quad (2)$$

Here, B is a constant which depends on said fraction and on the emitter area ratios of the relevant transistors.

The current $Ic_{2A}$ also flows through the transistor T9A. The base current of the transistor T9A is approximately equal to the collector current $Ic_{7A}$ of the transistor T7A. As a result:

$$Ic_{2A} = \beta_{9A} * Ic_{7A} \quad (3)$$

where $\beta_{9A}$ is the current gain of the transistor T9A. Equations (1), (2) and (3) then yield the following relationship for the current $Ic_{3A}$ through the transistor T3A:

$$Ic_{3A} = \beta_{9A} * B * (I_3)^2 / A / I_1 \quad (4)$$

The quiescent current through the transistor T3B can be derived in a similar manner. When unipolar FET transistors are used the formulas should be adapted but the effect is essentially the same.

The maximum current which can be supplied by the transistor T3A is approximately:

$$Ic_{3A,max} = 0.5 * I_3 * \beta_{7A} * \beta_{9A} * \beta_{3A} \quad (5)$$

where $\beta_{7A}$ and $\beta_{3A}$ are the current gain factors of the transistors T7A and T3A. A similar relationship is valid for the maximum current of the transistor T3B.

The voltage-to-current converter is suitable for measuring small voltages across sensing resistors with a very low resistance, as for example in power supplies and battery chargers. Then, the input voltage source 22 is formed by the sensing resistor and the input voltage $U_i$ is the voltage drop produced across the sensing resistor as a result of the current through the sensing resistor.

The optional current mirror 28 may be of conventional construction. Series resistors may be arranged in series with the emitters of the transistors T9A/T9B in order to improve the symmetry. A resistor may be added between the second supply terminal 16 and the collectors of the transistors T7A/T7B in order to improve the rate at which a small quiescent current is restored in the case of rapidly varying input voltages. Resistors may be added in series with the emitters of the transistors T7A/T7B in order to limit the rate at which the quiescent current increases in the case of rapidly varying input voltages. The current sources 4A, 4B and 56 may be provided with a multiple output current source in order to obtain a fixed relationship between the currents $I_1$ and $I_3$. All or some of the bipolar transistors may be replaced by unipolar (FET) transistors. Moreover, transistors of opposite conductivity types may be used without detriment to the correct operation of the circuits disclosed herein.

I claim:

1. A voltage-to-current converter comprising: a first cell which comprises: a first input terminal, a second input terminal and an output terminal, a first current source, a first transistor having a first main electrode, a second main electrode and a control electrode, having a main current path defined by the first and the second main electrode of the first transistor and coupled to the first current source at a first node for the passage of a first current to be supplied by the first current source, and having a junction defined by the first main electrode and the control electrode of the first transistor and connected in a forward direction between the first node and the first input terminal, a second current source, a second transistor of a first conductivity type, having a first main electrode connected to the second input terminal, a control electrode connected to the first node, and a second main electrode coupled to the second current source at a second node, and a third transistor of the first conductivity type, having a first main electrode connected to the first input terminal, a control electrode connected to the second node, and a second main electrode coupled to the output terminal, characterised in that the second current source comprises a controllable current source having a control input, wherein the first cell further comprises a differential amplifier having an output and inputs which are arranged to compare a voltage difference between the control electrode and the first main electrode of the third transistor with a reference voltage which is a measure of the current through the third transistor, a first and a second common input terminal, a second cell identical to the first cell, the first input terminal of the first cell and a second input terminal of the second cell being interconnected at the first common input terminal, and the second input terminal of the first cell and a first input terminal of the second cell being interconnected at the second common input terminal, an adder having inputs coupled to respective outputs of the respective differential amplifiers of the first and second cells, and having an output coupled to the respective control inputs of the second current sources of the first and second cells to supply a respective control signal to the control inputs, and a reference voltage source to supply the reference voltage for the first and the second cell.

2. A voltage-to-current converter as claimed in claim 1, wherein the reference voltage source comprises: a third current source, a third node and a fourth node, a first resistor connected between the fourth node and the first main electrode of the third transistor of the first cell, a second resistor connected between the fourth node and the first main electrode of the third transistor of the second cell, a junction formed by a control electrode and a first main electrode of a fourth transistor is connected between the third node and the fourth node, the first and the second cell each having one of the inputs of its respective differential amplifier connected to the control electrode of its respective third transistor and having the other input connected to the third node.

3. A voltage-to-current converter as claimed in claim 2, wherein the fourth transistor is of a second conductivity type opposite to the first conductivity type, and in that the control electrode, the first main electrode and the second main electrode of the fourth transistor are connected to the fourth node, the third node and a first supply terminal, respectively.

4. A voltage-to-current converter as claimed in claim 1, wherein the reference voltage source comprises: a third current source, a third node, a fifth transistor of a second conductivity type opposite to the first conductivity type, having a first main electrode connected to the third node, a control electrode connected to the first main electrode of the third transistor of the first cell, and a second main electrode coupled to a first supply terminal, and a sixth transistor of the second conductivity type, having a first main electrode connected to the third node, a control electrode connected to the first main electrode of the third transistor of the second cell, and a second main electrode coupled to the first supply terminal, the first and the second cell each having one of the inputs of its respective differential amplifier connected to the control electrode of its respective third transistor and having the other input connected to the third node.

5. A voltage-to-current converter as claimed in claim 2, wherein the differential amplifier in the first cell and in the second cell each comprises a seventh transistor of the first conductivity type, which seventh transistor has a control electrode connected to the third node, a first main electrode coupled to the second node of its cell, and a second main electrode coupled to the control input of the second current source of its cell, and in that the third node is connected to the junction of the fourth transistor via a diode-connected eighth transistor.

6. A voltage-to-current converter as claimed in claim 4, wherein the differential amplifier in the first cell and in the second cell each comprises a seventh transistor of the first conductivity type, which seventh transistor has a control electrode connected to the third node, a first main electrode coupled to the second node of it cell, and a second main electrode coupled to the control input of the second current source of its cell, and in that the third node is connected to the first main electrodes of the fifth and the sixth transistor via a diode-connected eighth transistor.

7. A voltage-to-current converter as claimed in claim 1, wherein the second current source in the first and the second cell comprises a ninth transistor of a second conductivity type opposite to the first conductivity type, said ninth transistor having a first main electrode coupled to a second supply terminal, a second main electrode coupled to the second node of its cell, and a control electrode forming the control input of the second current source.

8. A voltage-to-current converter as claimed in claim 1, wherein the first transistor in the first and the second cell is of a second conductivity type opposite to the first conductivity type, which first transistor has a control electrode, a first main electrode and a second main electrode connected to the first main electrode of the third transistor of its cell, the first node of its cell and the first supply terminal, respectively.

9. A voltage-to-current converter as claimed in claim 1, wherein the voltage-to-current converter further comprises a current mirror having an input coupled to the output terminal of the first cell, and having a common output terminal coupled both to an output of the current mirror and to the output terminal of the second cell.

10. A voltage-to-current converter as claimed in claim 3, wherein the differential amplifier in the first cell and in the second cell each comprises a seventh transistor of the first conductivity type, which seventh transistor has a control electrode connected to the third node, a first main electrode coupled to the second node of its cell, and a second main electrode coupled to the control input of the second current source of its cell, and in that the third node is connected to the junction of the fourth transistor via a diode-connected eighth transistor.

11. A voltage-to-current converter as claimed in claim 2, wherein the second current source in the first and the second cell each comprises a ninth transistor of a second conductivity type opposite to the first conductivity type, said ninth transistor having a first main electrode coupled to a second supply terminal, a second main electrode coupled to the second node of its cell, and a control electrode forming the control input of the second current source.

12. A voltage-to-current converter as claimed in claim 4, wherein the second current source in the first and the second cell each comprises a ninth transistor of a second conductivity type opposite to the first conductivity type, said ninth transistor having a first main electrode coupled to a second supply terminal, a second main electrode coupled to the second node of its cell, and a control electrode forming the control input of the second current source.

13. A voltage-to-current converter as claimed in claim 2, wherein the first transistor in the first and the second cell is of a second conductivity type opposite to the first conductivity type, which first transistor has a control electrode, a first main electrode and a second main electrode connected to the first main electrode of the third transistor of its cell, the first node of its cell and the first supply terminal, respectively.

14. A voltage-to-current converter as claimed in claim 4, wherein the first transistor in the first and the second cell is of a second conductivity type opposite to the first conductivity type, which first transistor has a control electrode, a first main electrode and a second main electrode connected to the first main electrode of the third transistor of its cell, the first node of its cell and the first supply terminal, respectively.

15. A voltage-to-current converter comprising first and second cells wherein each cell comprises;

first, second and third transistors, a first input terminal coupled to a first current source via the first transistor and to an output terminal via a main current path of the third transistor, a second input terminal coupled to a second controllable current source via a main current path of the second transistor, means connecting a control electrode of the third transistor to a node between the second current source and the second transistor, a differential amplifier which compares a voltage difference between a control electrode and a first main electrode of the third transistor with a reference voltage representative of a current flow through the third transistor, said converter further comprising;

means coupling the first input terminal of the first cell to the second input terminal of the second cell and vice versa, and an adder for summing output signals of the respective differential amplifiers of the first and second cells to supply a control signal to respective control inputs of the second current sources of the first and second cells thereby to control respective quiescent currents through the third transistors of said first and second cells.

16. A voltage-to-current converter as claimed in claim 15 wherein the first transistor comprises a diode-connected transistor.

17. A voltage-to-current converter as claimed in claim 15 wherein said first input terminal is coupled to the first current source via a base/emitter junction of the first transistor, said first transistor being of opposite conductivity type to said second and third transistors.

* * * * *